(12) United States Patent
Jung et al.

(10) Patent No.: US 7,378,703 B2
(45) Date of Patent: May 27, 2008

(54) SEMICONDUCTOR DEVICE HAVING STEP GATES AND METHOD FOR FABRICATING THE SAME

(75) Inventors: Tae-Woo Jung, Kyoungki-do (KR); Sang-Won Oh, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 40 days.

(21) Appl. No.: 11/320,884

(22) Filed: Dec. 28, 2005

(65) Prior Publication Data

US 2006/0170059 A1 Aug. 3, 2006

(30) Foreign Application Priority Data

Jan. 31, 2005 (KR) .................... 10-2005-0008742

(51) Int. Cl.
*H01L 27/108* (2006.01)

(52) U.S. Cl. ............... 257/296; 257/213; 257/288; 257/E27.084; 257/E21.218; 438/689; 438/706; 438/707; 438/710; 438/713

(58) Field of Classification Search ............ None
See application file for complete search history.

(56) References Cited

U.S. PATENT DOCUMENTS 5,210,056 A * 5/1993 Pong et al. ............... 438/773
5,843,846 A * 12/1998 Nguyen et al. ........... 438/713
6,465,831 B1 * 10/2002 Park et al. ................ 257/306

FOREIGN PATENT DOCUMENTS

| KR | 2001-0017172 | 3/2001 |
| KR | 10-2006-0075424 | 7/2006 |
| KR | 10-2006-0076533 | 7/2006 |
| KR | 10-2006-0087875 | 8/2006 |
| KR | 10-2006-0087897 | 8/2006 |

* cited by examiner

*Primary Examiner*—Ahmed Sefer
*Assistant Examiner*—Kevin Quinto
(74) *Attorney, Agent, or Firm*—Finnegan, Henderson, Farabow, Garrett & Dunner, L.L.P.

(57) ABSTRACT

The semiconductor device includes a substrate including a first active region and a second active region having a greater height than that of the first active region. A gate pattern has a step structure, which is formed on a border region between the first active region and the second active region. The gate pattern extends from a predetermined portion of the first active region to a predecided portion of the second active region. Gate spacers are formed on both sidewalls of the gate pattern. A first cell junction is formed in the first active region at one gate spacer and connected to a storage node contact. A second cell junction is formed in the second active region at the other gate spacer and connected to a bit line contact.

17 Claims, 8 Drawing Sheets

ROUNDING TREATMENT

SEMICONDUCTOR DEVICE HAVING STEP GATES AND METHOD FOR FABRICATING THE SAME

FIELD OF THE INVENTION

An embodiment of the present invention relates to semiconductor device fabrication and to a semiconductor device having a step gate.

DESCRIPTION OF RELATED ARTS

In order to increase a refresh property by increasing a refresh time in dynamic random access memory (DRAM) devices, mainly a capacitor property of the device has been improved. However, as the scale of integration of the devices has increased, there is a limitation in increasing the refresh time using only the improvement of the capacitor property.

Typically, a threshold voltage changes depending on a channel length and accordingly, the refresh property of a cell changes as well. For the improvement of the refresh property, the channel length should be increased and thus, a method for increasing a critical dimension (CD) of a gate electrode is used.

However, to increase the channel length, if the critical dimension (CD) of the gate electrode is increased, a relatively large electric field is induced. Thus, a limitation is created in that the threshold voltage is abruptly decreased. Furthermore, if the critical dimension (CD) of the gate electrode is increased, the scale of integration of the cell is degraded.

Recently, as the scale of integration of semiconductor devices has increased, it is impossible to decrease the critical dimension (CD) of the gate electrode and accordingly, the channel length is decreased. As described above, if the channel length is decreased, a short channel effect abruptly decreasing the threshold voltage is generated and thus, the short channel effect causes degradation in the refresh property.

Figure 1:
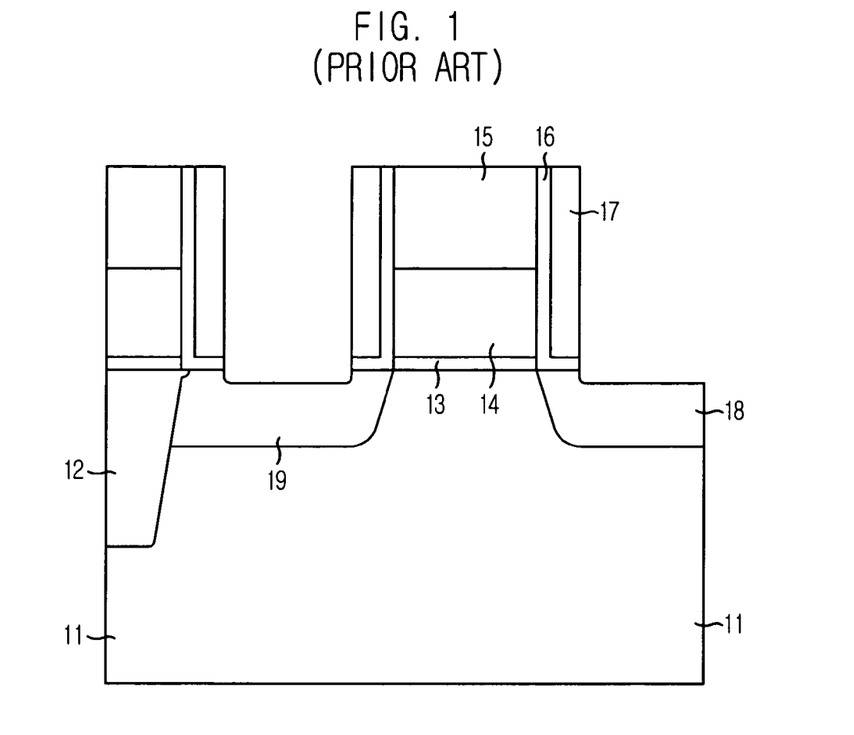
FIG. 1 is a cross-sectional view illustrating a conventional semiconductor device.

FIG. 1 is a cross-sectional view illustrating a conventional semiconductor device.

Referring to FIG. 1, a device isolation layer 12 with a shallow trench isolation (STI) structure is formed in a substrate 11, and a plurality of gate patterns formed by sequentially stacking a plurality of gate insulation layers 13, a plurality of gate electrodes 14 and a plurality of hard masks 15 are formed on upper portions of the substrate 11. On both sidewalls of the gate patterns, a plurality of gate spacers formed with use of a plurality of oxide layer spacers 16 and a plurality of nitride layer spacer 17 are formed.

A first junction 18 and a second junction 19 are formed in the substrate 11 between the plurality of gate patterns through an ion-implantation process. The first junction 18 is a bit line contact region to which a bit line will be contacted and the second junction 19 is a storage node contact region to which a storage node will be contacted.

As shown in FIG. 1, in case that a transistor, i.e., a planar transistor, with a channel length limited by a critical dimension of the individual gate electrode 14 directly formed on the substrate is used as a cell transistor of the DRAM devices, relatively large electric field is induced, thereby generating a serious defect in which a threshold voltage of the cell transistor is reduced.

For instance, according to the conventional method for using the planar transistor as the cell transistor, it is measured that the threshold voltage of the cell transistor (C-$V_T$) is $1.7 \times 10^{13}$ V; a size of the electric field is 0.58 MV/cm; and a refresh property (S-tREF) is 190 ms.

As described above, if the refresh property (S-tREF) is dropped below 190 ms, a limitation degrading yields of products during fabrication of the DRAM devices is created in DRAM devices with a size of 100 nm.

SUMMARY OF THE INVENTION

An embodiment of the invention is a semiconductor device with a smaller reduction in threshold voltage of its cell. Another embodiment of the invention is a method for fabricating such a device.

In accordance with one aspect of the present invention, there is provided a semiconductor device, including: a substrate including a first active region and a second active region having a higher height than that of the first active region; a gate pattern having a step structure, which is formed on a border region between the first active region and the second active region, wherein the gate pattern extends from a predetermined portion of the first active region to a predecided portion of the second active region; gate spacers formed on both sidewalls of the gate pattern; a first cell junction formed in the first active region at one gate spacer and connected to a storage node contact; and a second cell junction formed in the second active region at the other gate spacer and connected to a bit line contact.

In accordance with another aspect of the present invention, there is provided a method for fabricating a semiconductor device, including: forming a substrate including a first active region and a second active region having a higher height than that of the first active region; performing a rounding treatment on a border region between the first active region and the second active region; forming a gate insulation layer on a surface of the substrate including the border region subjected to the rounding treatment; forming a gate pattern having a step structure on the gate insulation layer of an upper portion of the border region between the first active region and the second active region, wherein the gate pattern extends from a predetermined portion of the first active region to a predecided portion of the second active region; forming gate spacers on both sidewalls of the gate pattern; and forming a first cell junction in the first active region at the same time of forming a second cell junction in the second active region.

BRIEF DESCRIPTION OF THE DRAWINGS

The above and other features of the present invention will become better understood with respect to the following description of the preferred embodiments given in conjunction with the accompanying drawings, in which.

DETAILED DESCRIPTION OF THE INVENTION

Hereinafter, detailed descriptions of certain embodiments of the present invention will be provided with reference to the accompanying drawings.

Figure 2:
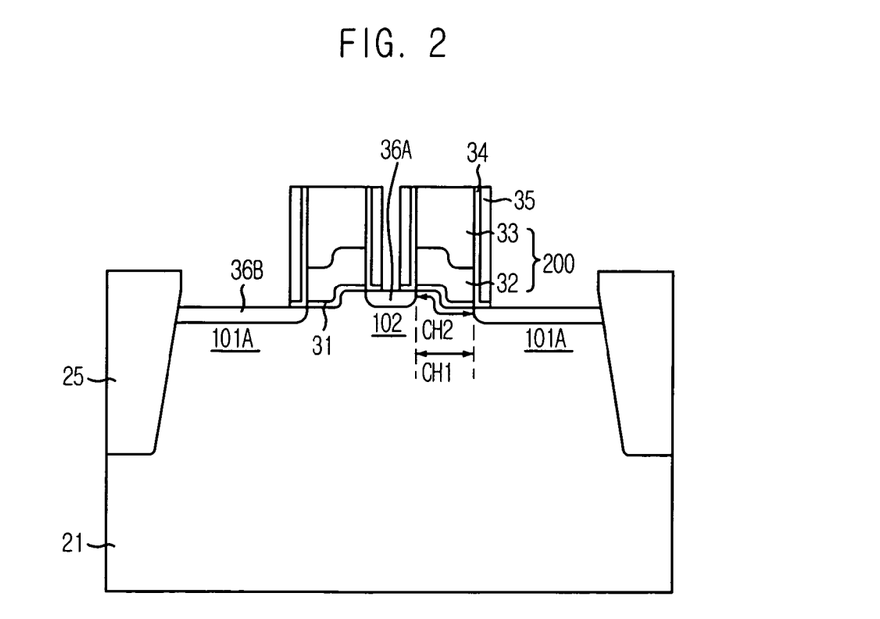
FIG. 2 is a cross-sectional view illustrating a semiconductor device having a plurality of step gates in accordance with a specific embodiment of the present invention.

FIG. 2 is a cross-sectional view illustrating a semiconductor device having a plurality of step gates in accordance with an embodiment of the present invention.

As shown in FIG. 2, the semiconductor device includes a substrate 21 having a plurality of recessed first active regions 101A and a second active region 102 having a greater height than that of the recessed first active regions 101A; a plurality of device isolation layers 25 in contact with the recessed first active regions 101A; a plurality of gate patterns 200 with a step structure, each extending from a surface of the individual recessed first active region 101A to a surface of the second active region 102; a plurality of gate spacers 34 and 35 formed on both sidewalls of each of the gate patterns 200; a plurality of first cell junctions 36B formed inside of the first active regions 101A; and a second cell junction 36A formed in the second active region 102. Herein, a plurality of gate oxide layers 31 are formed beneath the plurality of gate patterns 200. Accordingly, a plurality of gate electrodes 32 and a plurality of hard masks 33 stacked on the plurality of gate oxide layers 31 form the plurality of gate patterns 200. In this embodiment, the plurality of first cell junctions 36B and the second cell junction 36A are doped with N-type impurities.

As shown in FIG. 2, the recessed first active regions 101A and the second active region 102 have a height difference ranging from approximately 200 Å to approximately 600 Å. Because of the height difference, a channel length defined beneath the plurality of gate patterns 200 becomes longer. That is, since each of the gate patterns 200 is formed by extending from a portion of the individual recessed first active region 101A to a portion of the second active region 102, the channel length becomes longer by as much as the height difference between the individual recessed first active region 101A and the second active region 102. That is, assuming that a channel length of the conventional planar transistor is CH1, the channel length of a transistor in accordance with an embodiment of the present invention is CH2.

In the recessed first active regions 101A having a lower height than that of the second active region 102, the plurality of first cell junctions 36B to which a storage node contact will be connected are formed and the second cell junction 36A to which a bit line contact will be connected is formed in the second active region 102.

A height difference is also created between the recessed first active regions 101A and the device isolation layers 25. At this time, the height difference between the recessed first active regions 101A and the device isolation layers 25 ranges from approximately 0 Å to approximately 150 Å. Herein, although the reason why the height difference between the first active regions 101A and the device isolation layers 25 is generated will be explained in a subsequent fabrication method later, the height difference is decided based on an etching process of a recess pattern for forming the recessed first active regions 101A and subsequent cleaning processes performed several times.

Referring to FIG. 2, the cell transistor in accordance with an embodiment of the present invention includes the plurality of gate patterns 200 having a step gate structure, and has an asymmetric structure because the plurality of first cell junctions 36B serving a role of a source or a drain and the second cell junction 36A are formed in the recessed first active region 101A and the second active region 102 respectively.

FIGS. 3A to 3F are cross-sectional views illustrating a method for fabricating the semiconductor device having the step gate shown in FIG. 2.

Figure 3A:
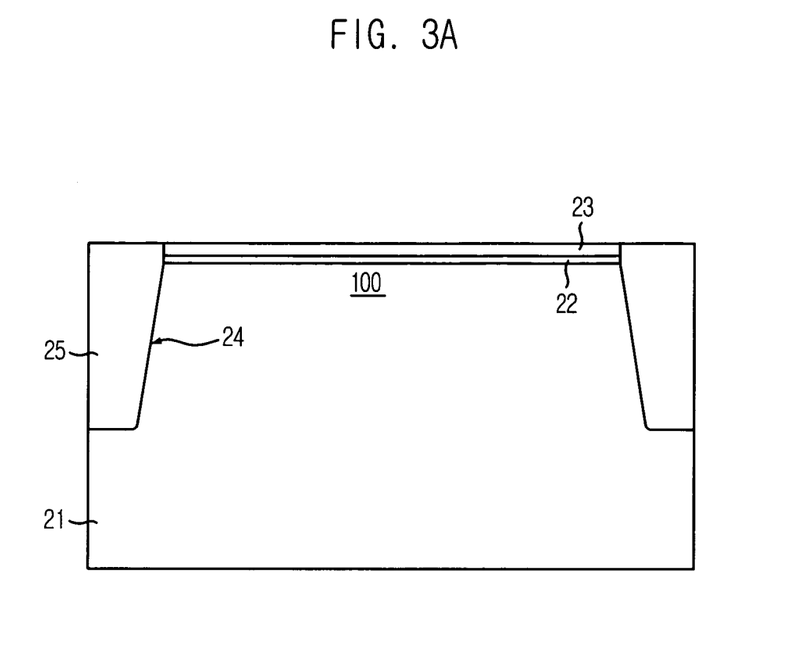
FIGS. 3A to 3G are cross-sectional views illustrating a method for fabricating the semiconductor device having the plurality of step gates shown in FIG. 2 in accordance with the specific embodiment of the present invention.

As shown in FIG. 3A, a pad oxide layer 22 and a pad nitride layer 23 are sequentially formed on a substrate 21. Herein, the pad nitride layer 23 serves not only a role of an etch stop layer but also a role of a polishing stop layer during a subsequent chemical mechanical polishing (CMP) process. Preferably, the pad oxide layer 22 is a silicon oxide ($SiO_2$) layer having a thickness ranging from approximately 50 Å to approximately 100 Å, and the pad nitride layer 23 is a silicon nitride ($Si_3N_4$) layer having a thickness ranging from approximately 700 Å to approximately 1,000 Å.

Next, a photoresist layer is deposited on the pad nitride layer 23. Then, the photoresist layer is patterned through a photo exposure process and a developing process, thereby forming a device isolation mask (not shown). Afterwards, the pad nitride layer 23 and the pad oxide layer 22 are sequentially etched by using the device isolation mask (not shown) as an etch barrier.

Next, the device isolation mask (not shown) is removed and afterwards, the pad oxide layer 22 is etched by using the pad nitride layer 23 as a hard mask. Thereafter, the substrate 21 exposed by the etching process subjected to the pad oxide layer 22, i.e., a device isolation region, is etched in a predetermined depth, thereby forming a plurality of trenches 24.

Next, a plurality of gap-fill insulation layers 25 are deposited until filling the trenches 24 and then, a CMP process is performed. At this time, during performing the CMP process, the pad nitride layer 23 serves a role of the polishing stop layer. Also, as well known, a sidewall oxidation process and a liner nitride layer process can be performed before the gap-fill insulation layers 25 are deposited. The gap-fill insulation layers 25 are oxide layers deposited through a high density plasma (HDP) method.

The gap-fill insulation layers 25 play a role of a device isolation layer. Accordingly, the gap-fill insulation layers 25 will be referred as the device isolation layers 25 hereinafter. The remaining substrate 21 is defined as an active region 100 by the device isolation layers 25, and a surface of the active region 100 is a planar type.

Meanwhile, after the CMP process which is the lastly performed process for forming the device isolation layers 25, a post cleaning process is performed to remove polishing by-products. At this time, the post cleaning process, i.e., a CMP post cleaning process, performed after the CMP process uses a BFN cleaning solution.

Figure 3B:
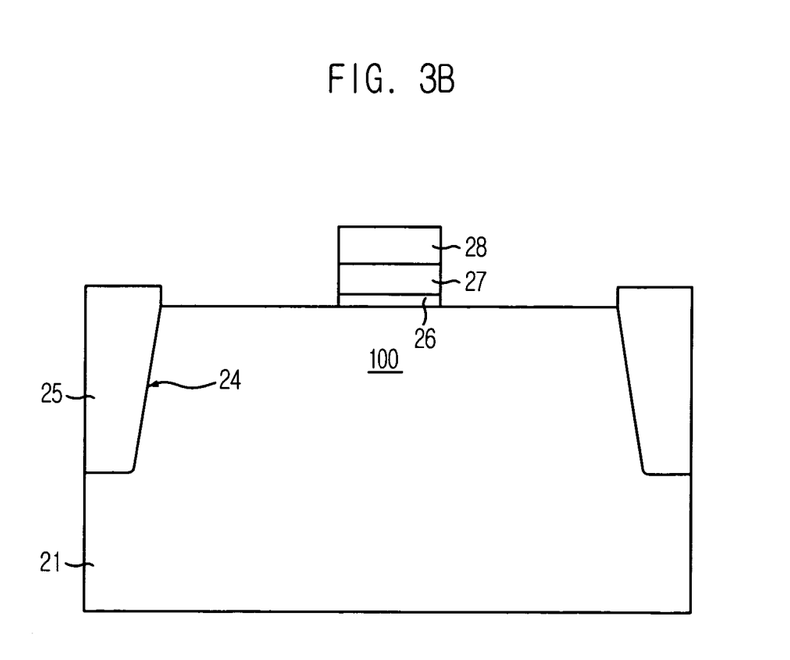

As shown in FIG. 3B, the pad nitride layer 23 and the pad oxide layer 22 are subjected to stripping. At this time, the pad nitride layer 23 is stripped by using a phosphoric acid ($H_3PO_4$) solution, and the pad oxide layer 22 is stripped by using hydrogen fluoride (HF) solution.

Subsequently, a cell oxidation process is performed on the surface of the active region 100, thereby forming a cell oxide layer 26 in a thickness ranging from approximately 50 Å to approximately 100 Å. Herein, the cell oxide layer 26 may not be formed in case that the pad oxide layer 22 remains without being subjected to stripping. That is, the pad oxide layer 22 is not stripped but remains and thus, the pad oxide layer 22 serves a role of performing the cell oxidation layer 26.

Next, an organic anti-reflective coating layer 27 is formed on an upper portion of the cell oxide layer 26. A photoresist layer is deposited on the organic anti-reflective coating layer 27 and then, the photoresist layer deposited on the organic anti-reflective coating layer 27 is patterned by a photo exposure process and a developing process. Thus, a mask 28 is formed on the organic anti-reflective coating layer 27.

At this time, the mask 28 serves a role of a recess mask for recessing the active region 100 to which a storage node will be connected in a predetermined thickness.

Next, the organic anti-reflective coating layer 27 and the cell oxide layer 26 are sequentially etched by using the mask 28 as an etch barrier.

At this time, the organic anti-reflective layer 27 is singly etched by using a mixed gas of tetrafluoromethane ($CF_4$), trifluoromethane ($CHF_3$) and oxygen ($O_2$). An etch selectivity of the organic anti-reflective coating layer 27 to the HDP oxide layer used as the device isolation layer 25 is controlled in a ratio of 1 to 1.

Figure 3C:
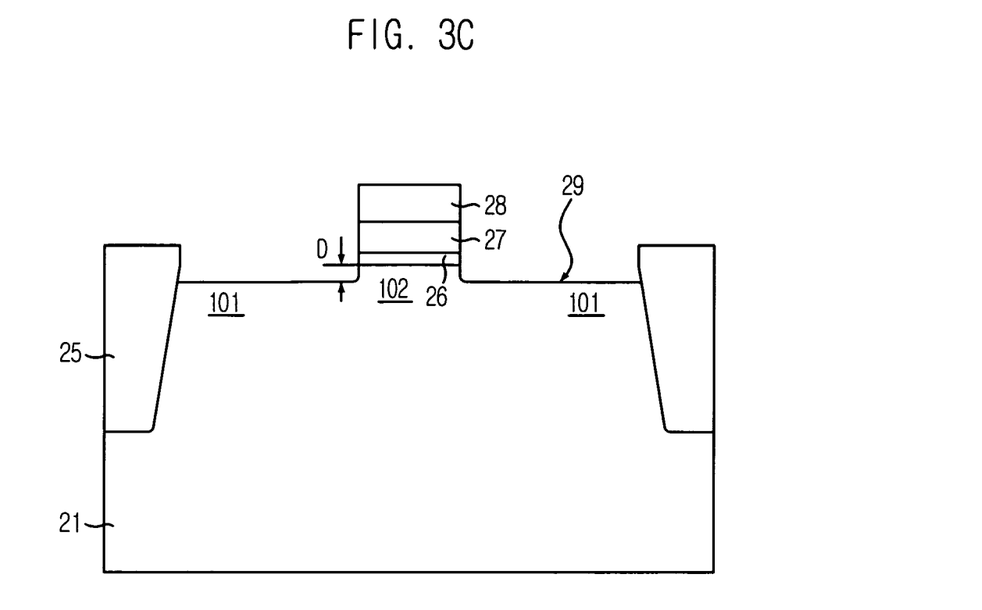

As shown in FIG. 3C, predetermined portions of the active region 100 exposed after etching the cell oxide layer 26 by using the mask 28 as an etch barrier are etched, thereby forming a plurality of line/space type recess patterns 29.

At this time, a depth of the individual recess patterns 29 is controlled to range from approximately 200 Å to approximately 600 Å. Thus, a height difference D between a plurality of first active regions 101 to which a storage node contact will be connected and a second active region 102 to which a bit line contact region will be connected ranges from approximately 200 Å to approximately 600 Å. That is, the plurality of first active regions 101 are formed in lower portions than the second active region 102 by as much as a thickness ranging from approximately 200 Å to approximately 600 Å.

As described above, the plurality of first active regions 101 to which the storage node contact will be connected have recessed surfaces by forming the recess patterns 29 and thus, the plurality of first active regions 101 and the second active region 102 have an asymmetric structure. Hereinafter, the plurality of first active regions 101 provided with the plurality of recess patterns 29 will be referred as a plurality of recessed first active regions 101A.

Figure 3D:
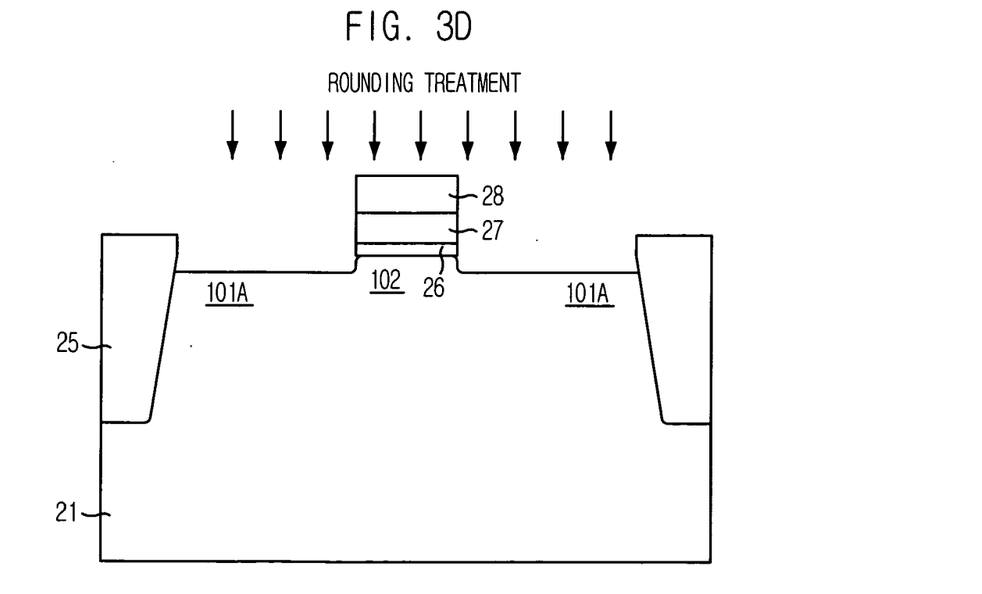

As shown in FIG. 3D, the plurality of recessed first active regions 101A are additionally etched through an isotopic etching method, thereby performing a rounding treatment to top corners of the recessed first active regions 101A, i.e., boundary portions between the recessed first active regions 101A and the second active region 102.

At this time, the isotropic etching method employed to perform the rounding treatment to edges of the recessed first active regions 101A carries out a soft etching by using a down stream etching method and a plasma method with a microwave type or an inductively coupled plasma (ICP) type. For instance, an isotropic etching condition singly uses a mixed gas of $CF_4$ and $O_2$, and a mixed gas of nitrogen trifluoride($NF_3$), $O_2$ and helium (He), or uses a mixed gas of the aforementioned mixed gases. An etching speed is controlled to be approximately 150 Å/minute.

Figure 3E:
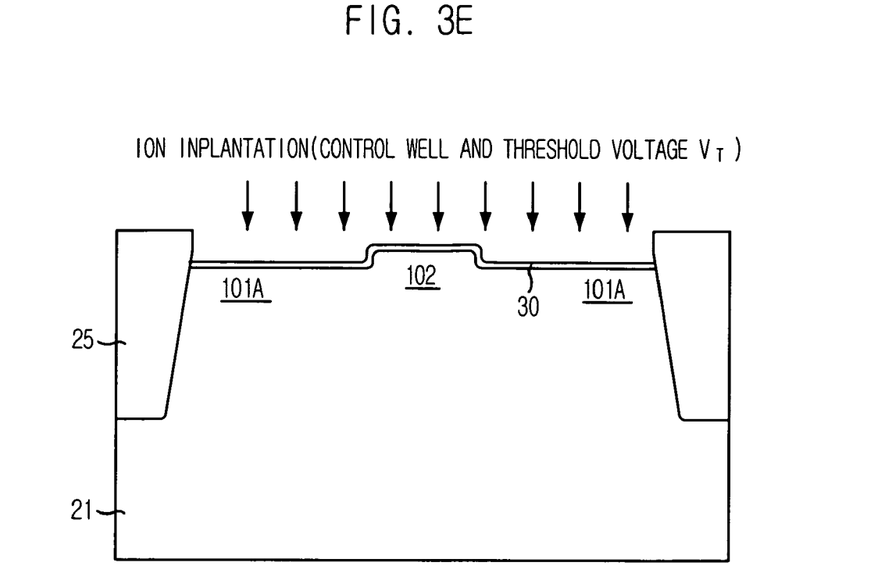

As shown in FIG. 3E, the mask 28 and the organic anti-reflective coating layer 27 are stripped and then, the cell oxide layer 26 is continuously removed. Herein, since the mask 28 is formed by using a photoresist layer, the mask 28 is stripped by using a typical oxygen plasma. At this time, the organic anti-reflective coating layer 27 is stripped simultaneously with the mask 28. The cell oxide layer 26 is removed by using a wet chemical solution such as a buffered oxide etchant (BOE) solution formed by mixing ammonium fluoride ($NH_4F$) and HF in a predetermined ratio, HF or a standard clean-1 solution formed by mixing ammonium hydroxide ($NH_4OH$), hydrogen peroxide ($H_2O_2$) and $H_2O$ in a predetermined ratio.

Next, a sacrificial oxide layer 30 is formed on an entire layer including the recessed first active regions 101A of which the edges, i.e., the boundary portions between the recessed first active region 101A and the second active region 102, are subjected to the rounding treatment by performing the isotropic etching process. At this time, the sacrificial oxide layer 30 is introduced to prevent a defect from being generated on the surface of the recessed first and the second active regions (101A and 102) while ion implantation processes, i.e., a well implantation process and a threshold voltage ($V_T$) implantation process, are performed to control a well and a threshold voltage ($V_T$). The sacrificial oxide layer 30 is a screen oxide layer or a threshold voltage oxide layer.

The sacrificial oxide layer 30 is formed through a dry oxidation process at a temperature ranging from approximately 800° C. to approximately 1,000° C. in a thickness ranging from approximately 50 Å to approximately 120 Å.

Next, the ion implantation process is performed to control the well and the threshold voltage ($V_T$) in a state which the sacrificial oxide layer 30 remains.

Figure 3F:
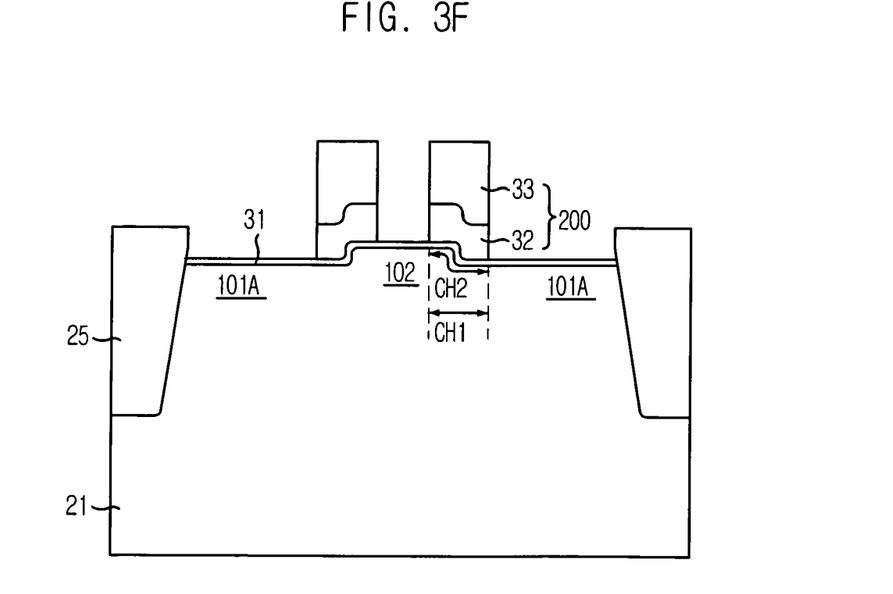

As shown in FIG. 3F, the sacrificial oxide layer 30 is stripped. Afterwards, a gate oxide layer pre-cleaning process is performed and then, a gate oxide layer 31 is formed on an entire resulting layer. At this time, the gate oxide layer 31 is formed through a dry oxidation process at a temperature ranging from approximately 850° C. to approximately 1,000° C. in a thickness ranging from approximately 100 Å to approximately 150 Å.

Next, each of the gate patterns 200 is formed by sequentially stacking a gate electrode 32 and a hard mask 33 on the gate oxide layer 31.

Although not shown, a top view of the gate pattern 200 observed in a major axis will be explained hereinafter. The gate pattern 200 has a wave type, wherein a predetermined portion of the gate pattern 200 passing an upper portion of the recessed first active region 101A is roundly projected toward the recessed first active region 101A and the other portion of the gate pattern 200 passing the remaining region, i.e., a upper portion of the device isolation layer 25, is not projected. For instance, a line width of the device isolation layer 25 is smaller that that of the recessed first region 101A.

As described above, the individual gate pattern 200 crosses the upper portion of the active region and the individual gate pattern 200 is formed by extending from the individual recessed first active region 101A in which the height difference is generated to the second active region 102, thereby forming a step gate structure.

Additional details about the individual gate pattern 200 are given. One side of the individual gate pattern 200 reaches a bottom portion of the individual recessed first active region 101A and the other side reaches a surface of the second active region 102. Thus, the individual gate pattern 200 is formed on the boundary region between the individual recessed first active region 101A and the second active region 102, thereby having a step-gate structure not a planar type.

As described above, since the individual gate pattern 200 has the step-gate structure by extending from the individual recessed first active region 101A and the planar second active region, a channel defined by the individual gate pattern 200 becomes longer than that of the gate pattern of the conventional planar transistor.

That is, if the channel length of the conventional planar transistor is CH1, the channel length of the transistor of the present invention is CH2. CH2 is longer than CH1 as much as a depth of the recess pattern 29 (see FIG. 3C).

Figure 3G:
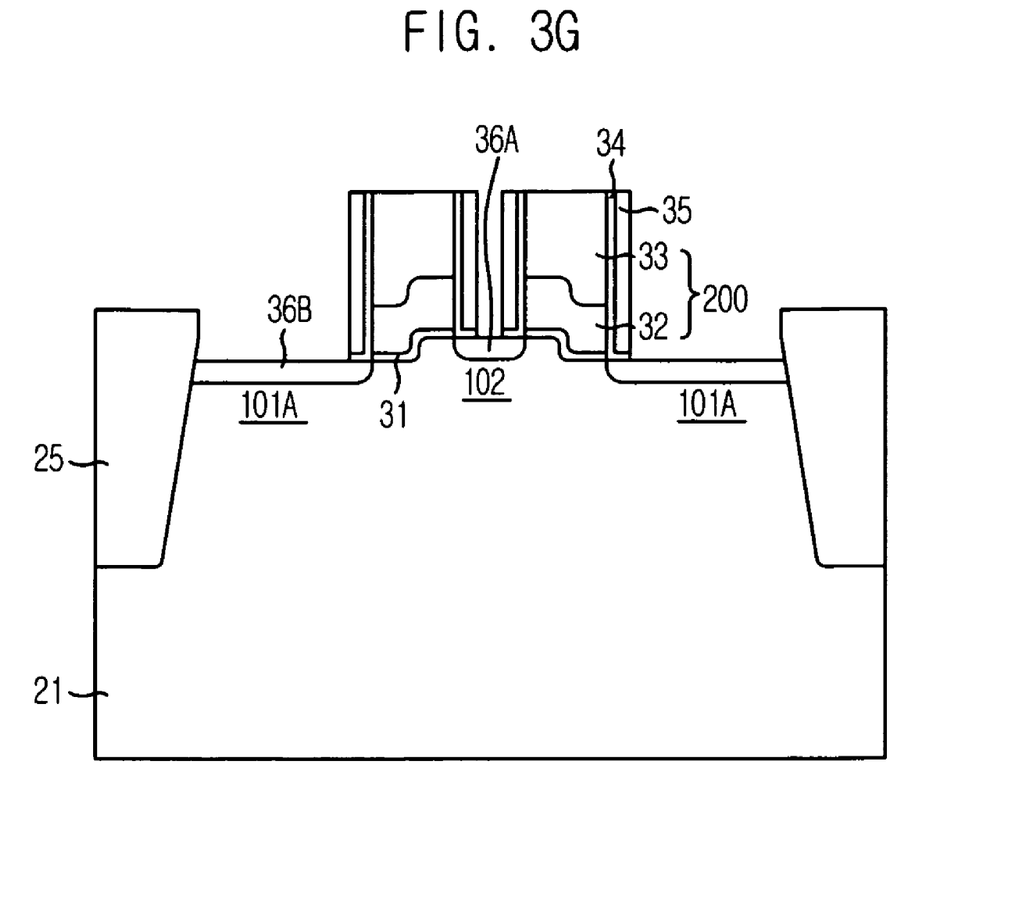

As shown in FIG. 3G, insulation layers, i.e., a stack layer of an oxide layer and a nitride layer, serving a role of a gate spacer are deposited on an entire layer including the gate patterns 200. Afterwards, a plurality of dual gate spacers, i.e., a plurality of oxide layer spacers 34 and a plurality of nitride layer spacers 35, in contact with both sidewalls of the gate patterns 200 are formed by performing a spacer etching process.

Next, an ion implantation process implanting N-type impurities, i.e. phosphorous (P) or arsenic (As), for forming cell junctions is performed on an entire layer provided with the gate spacers 34 and 35. Thus, a plurality of first cell junctions 36B are formed between the plurality of gate patterns 200 and the plurality of device isolation layers 25, and a second junction 36A is formed in the second active region 102 between the plurality of gate patterns 200. That is, the first cell junctions 36B are formed in the recessed first active regions 101A and the second cell junction 36A is formed in the second active region 102 higher than the recessed first active regions 101A.

The first cell junctions 36B formed in the recessed first active regions 101A will be connected to a storage node contact, and the second cell junction 36A formed in the second active region 102 will be connected to a bit line contact.

In accordance with an embodiment of the present invention, the cell transistor of the present invention includes the gate patterns 200 having the step-gate structure, and has an asymmetric structure because the first cell junctions 36B serving a role of a source (or a drain) and the second cell junction 36A serving a role of a drain (or a source) are formed in the recessed first active regions 101A and the second active region 102 respectively. That is, the second active region 102 to which the bit line contact is connected is formed in a structure without a recess and the first active regions 101A to which the storage node contact is connected are formed in a recess structure.

As described above, the first active regions 101A may be formed in a recess structure to provide the cell transistor having the step-gate structure and the asymmetric structure. That is, channel regions defined beneath the gate patterns 200 are formed in the step structure and then, the step structure is subjected to a rounding treatment. Accordingly, it is possible to improve a refresh property of the device by reducing a leakage current that may result from a leakage of the impurities implanted to the first cell junctions 36B.

Meanwhile, there is a height difference between the recessed first active regions 101A and the device isolation layers 25. At this time, the height difference ranges from approximately 0 Å to approximately 150 Å. Herein, the generation of the height difference between the recessed first active regions 101A and the device isolation layers 25 is decided based on a time control of an etching process for forming the recess patterns 29 (see FIG. 3C) and cleaning processes, performed subsequently in many times. That is, before the gate patterns 29 are formed, the gate oxide pre-cleaning process is employed. At this time, after the gate oxide pre-cleaning process, the height difference between the first active regions 101A and the device isolation layers 25 ranges from approximately 0 Å to approximately 150 Å.

Figure 4A:
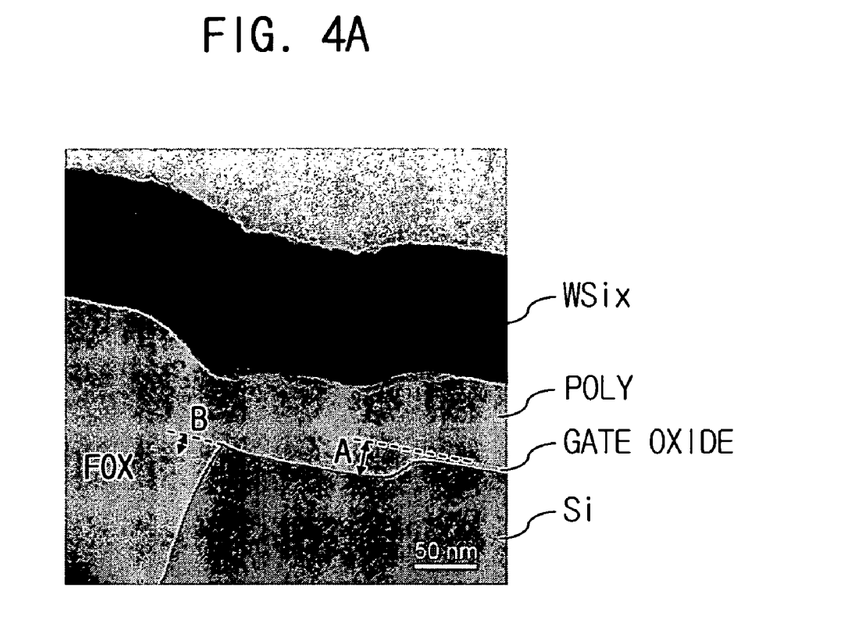
FIGS. 4A to 4F are photographs illustrating a depth of a recessed active region in accordance with the specific embodiment of the present invention.

FIGS. 4A to 4F are photos illustrating a depth of a recess pattern and a height difference between a device isolation layer and the recessed active region in accordance with a specific embodiment of the present invention. A reference denotation A denotes the depth of the recess pattern, and a reference denotation B denotes a height difference between the device isolation layer and the recessed active region. Hereinafter, FIG. 4A shows the case using a pad oxide layer as a cell oxide layer, and FIGS. 4B to 4F show the case using a cell oxide layer. FIGS. 4A to 4F are photos where a size of approximately 50 nm is indicated. Herein, a reference denotation FOX denotes a field oxide layer used for forming a device isolation layer; a reference denotation GATE OXIDE denotes a gate oxide layer; reference denotations WSix and POLY denote gate electrode materials; and Si denotes a substrate. Also, the sacrificial oxide layer is not shown because the sacrificial oxide layer is stripped.

Referring to FIG. 4A, the depth of the recess pattern measures approximately 190 Å and the height difference between the device isolation layer and the recessed active region measures approximately −110 Å. At this time, these measurements are obtained when a post cleaning process after a CMP process is employed by using a BFN solution for approximately 30 seconds; a pre-cleaning process before forming the cell oxide layer is performed by using a B solution; a cleaning process before a rounding treatment is performed by using a FN solution for approximately 130 seconds; a sacrificial oxide layer is formed in a thickness of approximately 50 Å at a temperature of approximately 1,000° C.; and a gate oxide layer is formed through a wet oxidation process at a temperature of approximately 750° C.

Figure 4B:
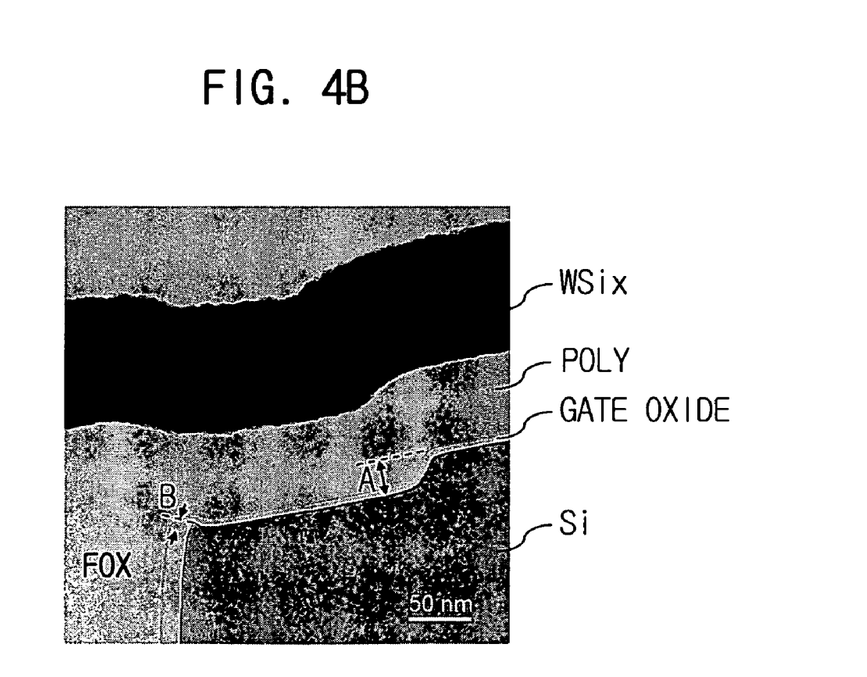

Referring to FIG. 4B, the depth of the recess pattern measures approximately 240 Å and the height difference between the device isolation layer and the recessed active region measures approximately −90 Å. At this time, these measurements are obtained when a post cleaning process after a CMP process is employed by using a BFN solution for approximately 30 seconds; a pre-cleaning process before forming the cell oxide layer is performed by using a FN solution for approximately 130 seconds; a cleaning process before a rounding treatment is performed by using a FN solution for approximately 75 seconds; a sacrificial oxide layer is formed in a thickness of approximately 50 Å at a temperature of approximately 1,000° C.; and a gate oxide layer is formed through a wet oxidation process at a temperature of approximately 750° C.

Figure 4C:
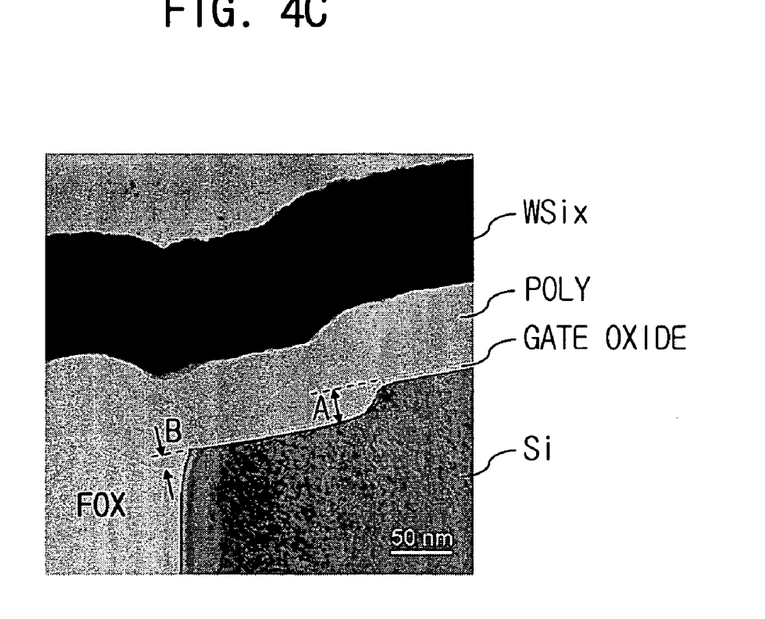

Referring to FIG. 4C, the depth of the recess pattern measures approximately 240 Å and the height difference between the device isolation layer and the recessed active region measures approximately −160 Å. At this time, these measurements are obtained when a post cleaning process after the CMP process is employed by using a BFN solution for approximately 30 seconds; a pre-cleaning process before forming the cell oxide layer is performed by using a FN solution for approximately 130 seconds; a cleaning process before a rounding treatment is performed by using a FN solution for approximately 130 seconds; a sacrificial oxide layer is formed in a thickness of approximately 50 Å at a temperature of approximately 1,000° C.; and a gate oxide layer is formed through a wet oxidation process at a temperature of approximately 750° C.

Figure 4D:
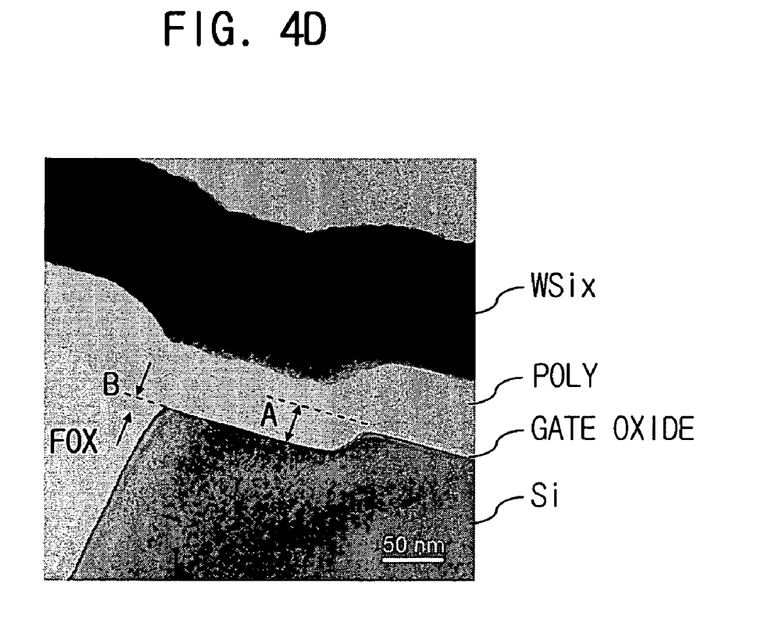

Referring to FIG. 4D, the depth of the recess pattern measures approximately 260 Å and the height difference between the device isolation layer and the recessed active region measures approximately −163 Å. At this time, these measurements are obtained when a post cleaning process after a CMP process is employed by using a BFN solution for approximately 90 seconds; a pre-cleaning process before forming the cell oxide layer is performed by using a FN solution for approximately 130 seconds; a cleaning process before a rounding treatment is performed by using a FN solution for approximately 130 seconds; a sacrificial oxide layer is formed in a thickness of approximately 50 Å at a temperature of approximately 1,000° C.; and a gate oxide layer is formed through a wet oxidation process at a temperature of approximately 750° C.

Figure 4E:
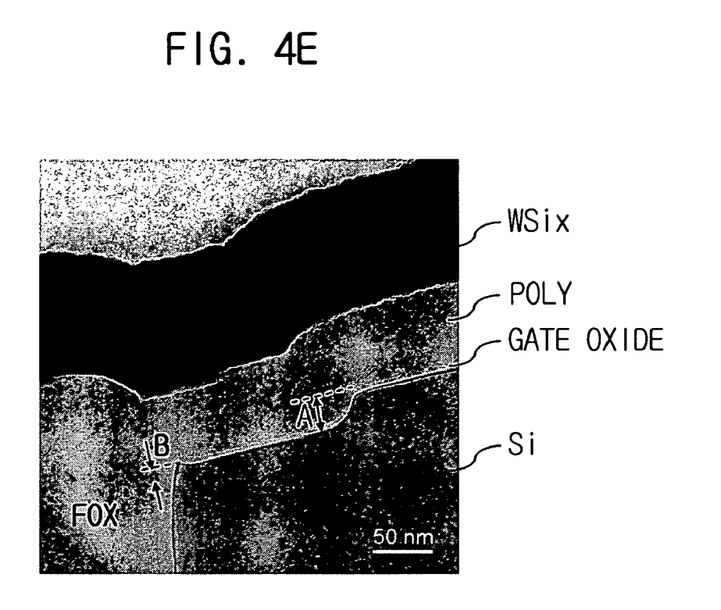

Referring to FIG. 4E, the depth of the recess pattern measures approximately 260 Å and the height difference between the device isolation layer and the recessed active region measures approximately −90 Å. At this time, these measurements are obtained when a post cleaning process after the CMP process is employed by using a BFN solution for approximately 30 seconds; a pre-cleaning process before forming the cell oxide layer is performed by using a FN solution for approximately 130 seconds; a cleaning process before a rounding treatment is performed by using a FN solution for approximately 75 seconds; a sacrificial oxide layer is formed in a thickness of approximately 50 Å at a temperature of approximately 1,000° C.; and a gate oxide layer is formed through a wet oxidation process at a temperature of approximately 750° C.

Figure 4F:
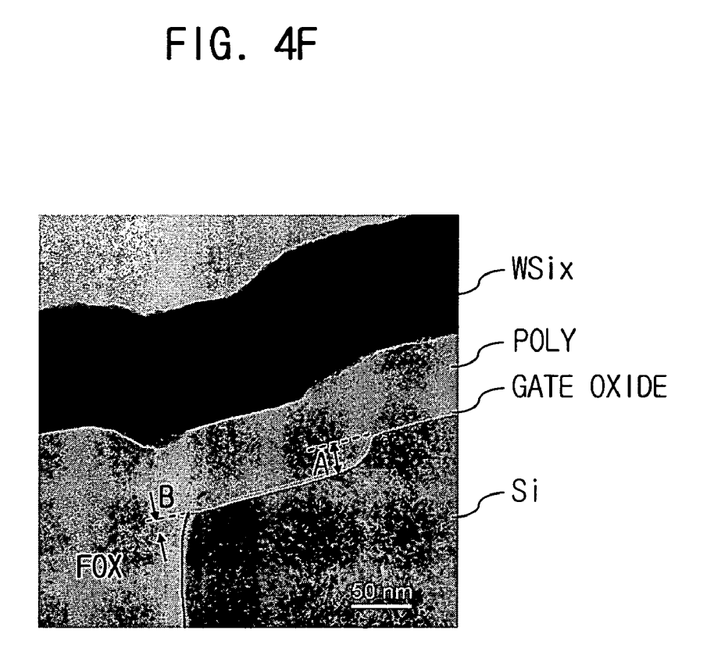

Referring to FIG. 4F, the depth of the recess pattern measures approximately 260 Å and the height difference between the device isolation layer and the recessed active region measures approximately −90 Å. At this time, these measurements are obtained when a post cleaning process after a CMP process is employed by using a BFN solution for approximately 30 seconds; a pre-cleaning process before forming the cell oxide layer is performed by using a FN solution for approximately 130 seconds; a cleaning process before the rounding treatment is performed by using a FN solution for approximately 75 seconds; a sacrificial oxide layer is formed in a thickness of approximately 50 Å at a temperature of approximately 1,000° C.; and a gate oxide layer is formed through a wet oxidation process at a temperature of approximately 750° C.

On the basis of an embodiment of the present invention, a height difference between an active region, i.e., a recessed active region, to which a storage node contact is connected and the other active region to which a bit line contact is connected is generated, thereby embodying a step-gate structure. Accordingly, it is possible to prevent a threshold voltage of a cell transistor from being reduced and to control the height difference between the recessed active region and a device isolation layer, thereby obtaining an effect in improving yields of products and a refresh property.

The present application contains subject matter related to the Korean patent application No. KR 2004-0008742, filed in the Korean Patent Office on Jan. 31, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A semiconductor device, comprising:
a substrate including a first active region, a second active region having a greater height than that of the first active region, and a device isolation layer in contact with the first active region;
a gate pattern composite having a step structure, which is formed on a border region between the first active region and the second active region, wherein the gate pattern composite extends from a predetermined portion of the first active region to a predetermined portion of the second active region;
gate spacers formed on both sidewalls of a gate pattern of the gate pattern composite;
a first cell junction formed in the first active region at one gate spacer and connected to a storage node contact; and
a second cell junction formed in the second active region at the other gate spacer and connected to a bit line contact,
wherein a first portion of the gate pattern passes an upper portion of the first active region and is roundly projected toward the first active region, thereby forming a wave pattern, and a second portion of the gate pattern passes an upper portion of the device isolation layer and is not roundly projected.

2. The semiconductor device of claim 1, wherein the height difference between the first active region and the second active region ranges from approximately 200 Å to approximately 600 Å.

3. The semiconductor device of claim 1, wherein the border region between the first active region and the second active region is subjected to a rounding treatment.

4. The semiconductor device of claim 1, wherein the height difference between the first active region and the device isolation layer ranges from approximately 0 Å to approximately 150 Å.

5. A method for fabricating a semiconductor device, comprising:
forming a substrate including a first active region and a second active region having a greater height than that of the first active region, and a plurality of device isolation layers in contact with the first active region;
performing a rounding treatment on a border region between the first active region and the second active region;
forming a gate insulation layer on a surface of the substrate including the border region subjected to the rounding treatment;
forming a gate pattern having a step structure on the gate insulation layer at the border region between the first active region and the second active region;
forming gate spacers on both sidewalls of the gate pattern; and
forming a first cell junction in the first active region at the same time as forming a second cell junction in the second active region,
wherein the rounding treatment is performed with an isotropic etching process using one of a mixed gas of $CF_4$ and $O_2$, a mixed gas of nitrogen trifluoride ($NF_3$), $O_2$ and He, or a combination thereof.

6. The method of claim 5, prior to the forming of the gate pattern, further comprising performing a pre-cleaning process wherein, after performing the pre-cleaning process, the height difference between the first active region and the device isolation layer ranges from approximately 0 Å to approximately 150 Å.

7. The method of claim 5, wherein the isotropic etching process employs a downstream method and uses a plasma source which has a microwave type or an inductively coupled plasma (ICP) type.

8. The method of claim 5, wherein the gate insulation layer is formed at a temperature ranging from approximately 850° C. to approximately 1,000° C. in a thickness ranging from approximately 100 Å to approximately 150 Å through a dry oxidation method.

9. The method of claim 5, wherein the gate pattern has a wave type in that a first portion of the gate pattern passes an upper portion of the recessed first active region and is roundly projected toward the recessed first active region and a second portion of the gate pattern passes an upper portion of the device isolation layer and is not roundly projected.

10. The method of claim 5, wherein the forming of the substrate further comprises:
   forming the plurality of device isolation layers in preset portions of the substrate; and
   defining the first active region as recessed by etching a certain portion, adjacent to the device isolation layers, of an active region defined by the device isolation layers and defining the second active region in a remaining portion of the active region except the certain portion where the first active region is formed.

11. The method of claim 10, wherein the height difference between the first active region and the second active region ranges from approximately 200 Å to approximately 600 Å.

12. The method of claim 10, wherein the defining of the recessed first active region includes:
   forming a first insulation layer on an upper portion of the substrate including the device isolation layers;
   forming an anti-reflective barrier layer on the first insulation layer;
   forming a mask on the anti-reflective barrier layer by using a photoresist layer;
   etching only the anti-reflective barrier layer by using the mask as an etch barrier;
   etching the first insulation layer by using the mask as an etch barrier;
   removing the mask; and
   defining the recessed first active region by etching the substrate a predetermined thickness by using the etched anti-reflective barrier layer as an etch barrier.

13. The method of claim 12, wherein defining the recessed first active region comprises using a mixed gas of tetrafluoromethane ($CF_4$), trifluoromethane($CHF_3$) and oxygen ($O_2$).

14. The method of claim 13, wherein during defining the recessed first active region using the mixed gas of $CF_4$, $CHF_3$ and $O_2$, an etching selectivity of the substrate with respect to the device isolation layers is controlled to a ratio of 1:1.

15. The method of claim 5, after performing the rounding treatment, further comprising: forming a sacrificial layer on the surface of the substrate including the border region subjected to the rounding treatment; performing an ion-implantation process in the substrate in a state which the sacrificial layer remains so as to control a threshold voltage and a well; and removing the sacrificial layer.

16. The method of claim 15, wherein forming sacrificial layer comprises a dry oxidation process.

17. The method of claim 15, wherein the sacrificial layer is formed at a temperature ranging from approximately 800° C. to approximately 900° C. in a thickness ranging from approximately 50 Å to approximately 120 Å.

* * * * *